United States Patent
Lin et al.

(10) Patent No.: US 11,201,114 B2
(45) Date of Patent: Dec. 14, 2021

(54) METHODS OF FORMING THIN FILM RESISTOR STRUCTURES UTILIZING INTERCONNECT LINER MATERIALS

(71) Applicant: Intel Corporation, Santa Clara, CA (US)

(72) Inventors: Kevin Lin, Beaverton, OR (US); Christopher J. Jezewski, Portland, OR (US); Richard F. Vreeland, Hillsboro, OR (US); Tristan A. Tronic, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/465,119

(22) PCT Filed: Dec. 29, 2016

(86) PCT No.: PCT/US2016/069153
§ 371 (c)(1),
(2) Date: May 29, 2019

(87) PCT Pub. No.: WO2018/125127
PCT Pub. Date: Jul. 5, 2018

(65) Prior Publication Data
US 2019/0326214 A1    Oct. 24, 2019

(51) Int. Cl.
*H01L 23/522*     (2006.01)
*H01L 21/768*     (2006.01)
(Continued)

(52) U.S. Cl.
CPC .... *H01L 23/5228* (2013.01); *H01L 21/76816* (2013.01); *H01L 21/76831* (2013.01); *H01L 27/016* (2013.01); *H01L 28/24* (2013.01)

(58) Field of Classification Search
CPC ........... H01L 23/5228; H01L 21/76816; H01L 21/76831; H01L 27/016; H01L 28/24;
(Continued)

(56) References Cited

U.S. PATENT DOCUMENTS

2006/0160299 A1    7/2006  Satyavolu et al.
2006/0252250 A1*  11/2006  Teng ................ H01L 21/76846
                                                            438/618
(Continued)

OTHER PUBLICATIONS

International Search Report & Written Opinion dated Sep. 28, 2017 for PCT Patent Application No. PCT/US16/69153.

*Primary Examiner* — Su C Kim
(74) *Attorney, Agent, or Firm* — Green, Howard & Mughal LLP

(57) ABSTRACT

Methods/structures of forming thin film resistors using interconnect liner materials are described. Those methods/structures may include forming a first liner in a first trench, wherein the first trench is disposed in a dielectric layer that is disposed on a substrate. Forming a second liner in a second trench, wherein the second trench is adjacent the first trench, forming an interconnect material on the first liner in the first trench, adjusting a resistance value of the second liner, forming a first contact structure on a top surface of the interconnect material, and forming a second contact structure on the second liner.

5 Claims, 19 Drawing Sheets

(51) Int. Cl.
*H01L 27/01* (2006.01)
*H01L 49/02* (2006.01)

(58) Field of Classification Search
CPC ......... H01L 21/76865; H01L 21/76856; H01L 21/76859; H01L 21/76843
See application file for complete search history.

(56) References Cited

U.S. PATENT DOCUMENTS

| | | |
|---|---|---|
| 2007/0040239 A1 | 2/2007 | Chinthakindi et al. |
| 2009/0140387 A1* | 6/2009 | Yang ................... H01L 23/5329 257/536 |
| 2012/0049324 A1 | 3/2012 | Le Neel et al. |
| 2012/0199942 A1* | 8/2012 | Kageyama .......... H01L 23/5258 257/529 |
| 2014/0098459 A1* | 4/2014 | Lee ................... H01L 27/10805 361/306.1 |
| 2014/0111301 A1 | 4/2014 | Williams et al. |
| 2015/0162396 A1 | 6/2015 | Yagi et al. |
| 2017/0154950 A1* | 6/2017 | Basker .................... H01L 28/24 |

* cited by examiner

METHODS OF FORMING THIN FILM RESISTOR STRUCTURES UTILIZING INTERCONNECT LINER MATERIALS

CLAIM OF PRIORITY

This Application is a National Stage Entry of, and claims priority to, PCT Application No. PCT/US16/69153, filed on Dec. 29, 2016, and titled "METHODS OF FORMING THIN FILM RESISTOR STRUCTURES UTILIZING INTERCONNECT LINER MATERIALS", which is incorporated by reference in its entirety for all purposes.

BACKGROUND

Thin film resistors may be used utilized in the fabrication of microelectronic devices, such as in the fabrication of integrated chips/devices. These resistor structures often require removal process steps, such as polishing process, in order to fabricate the resistor structures. In some cases, such removal processes may negatively impact the density of underlying interconnect structures, which may comprise routable conductive traces within a device, for example.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
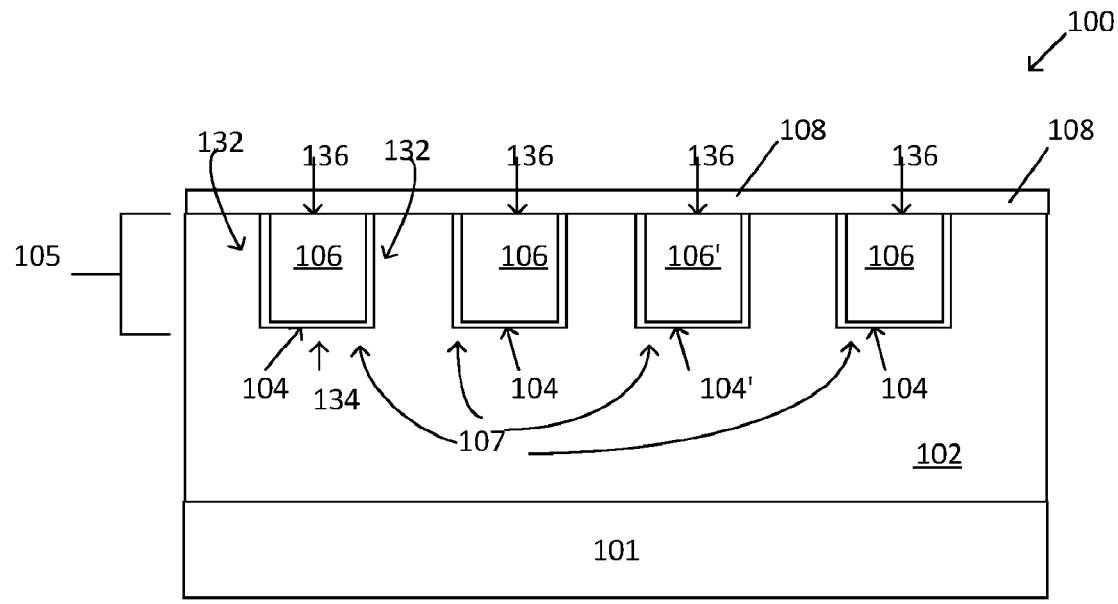
FIGS. 1a-1j represent cross-sectional views of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them. Embodiments of methods of forming device structures, such as methods of forming thin film resistors using interconnect liner materials, are described. Those methods/structures may include forming a first liner in a first trench, wherein the first trench is disposed in a dielectric layer that is disposed on a substrate. Forming a second liner in a second trench, wherein the second trench is adjacent the first trench, forming an interconnect material on the first liner in the first trench, adjusting a resistance value of the second liner, forming a first contact structure on a top surface of the interconnect material, and forming a second contact structure on the second liner. The embodiments herein enable the formation of thin film resistor structures which are patterned within the same layer of as an interconnect structure.

The various Figures herein illustrate embodiments of fabricating thin film resistor structures comprising interconnect structure liner material, such as titanium and or tantalum containing liner materials, for example. In FIG. 1a (cross-sectional view), a portion of a device/die 100, such as a microelectronic die, is shown. The portion of the device 100 may comprise a substrate 101, such as a silicon substrate, for example. The substrate 101 may be a monocrystalline silicon substrate, in an embodiment. The substrate 101 may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

A dielectric material/layer 102 may be disposed on the substrate 100. The dielectric layer may comprise an interlayer dielectric material (ILD) in an embodiment, and may comprise one or more of an oxide, such as silicon dioxide ($SiO_2$), silicon oxide (SiO), carbon-doped $SiO_2$, for example, a nitride, such as silicon nitride ($Si_3N_4$), a polymer, such as perfluorocyclobutane (C4F8) and/or polytetrafluoroethylene (PTFE), a phosphosilicate glass (PSG), a fluorosilicate glass (FSG), an organosilicate glass (OSG), such as silsesquioxane, siloxane, and/or a combination of any of the aforementioned. In an embodiment, the dielectric layer 102 may comprise low-κ dielectric material having a dielectric constant that is less than the dielectric constant of silicon dioxide ($SiO_2$). In some embodiments, the dielectric layer 102 may be substantially non-porous, whereas in some other embodiments, the dielectric layer 102 may be provided with any degree of porosity, as desired for a given application.

A plurality of trenches/interconnect structures 107 may be disposed adjacent to each other within the dielectric layer 102. In an embodiment, the individual ones of the plurality of trenches 107 may comprise a liner 104, and an interconnect material 106 within each of the individual ones of the plurality of trenches 107. In an embodiment, each of the individual trenches 107 may comprise sidewall portions ones 132 and may comprise a bottom portion 134. In some embodiments, the liner 104 may be at least partially conductive and may be disposed between the dielectric layer 102 and the interconnect material 106. The liner 104 may be disposed on at least a portion of the sidewalls 132 and on at least a portion of the bottom portion 134 of the trench structures 107. The trench structures 107 are depicted as rectangular in the figure, however other shapes are possible, such as wherein the bottom portion 134 of the trench 107 is rounded, and wherein the sidewalls 132 possess a slanted profile, for example.

In an embodiment, the liner 104 may comprise an interconnect barrier layer/liner 104. By way of illustration and not limitation, the liner 104 may be formed using techniques such as physical vapor deposition (PVD), atomic layer deposition (ALD), chemical vapor deposition (CVD), low pressure CVD or other such methods as applicable to the particular design requirements. In an embodiment, the liner 104 can include any one of the following materials: tantalum, tungsten, titanium, ruthenium, molybdenum, and their alloys with nitrogen, silicon and carbon. In another embodiment, the liner 104 may comprise such materials as silicon nitride (Si3N4), silicon dioxide (SiO2), silicon oxynitride (SiOxNy), titanium nitride (TiN), and silicon carbon nitride (SiCN).

Although a few examples of materials that may be used to form liner 104 are described here, the liner 104 may be made from other materials that serve to prevent the diffusion of a metal across the liner 104, in an embodiment. The liner 104 can range from about 1 nm to about 10 nm in thickness, in an embodiment, however in other embodiments the liner 104 may be formed from a variety of materials, thicknesses or multiple layers of material.

The interconnect material 106 may comprise various conductive materials, such as copper exclusively, or its alloys with tin, indium, cadmium, aluminum, magnesium, or its alloys with noble metals such as silver, palladium, platinum, rhodium, ruthenium, gold, iridium and osmium, for example. The interconnect material 106 may serve to form interconnect traces/routing traces, which may comprise multiple levels of interconnection structures 107 that are used to connect/route circuit elements (such as to planar and/or trigate transistor structures and to passive elements such as resistors for example) within the device 100, to each other. The interconnect material 106 may be formed by electroless and/or electroplating techniques, in an embodiment.

In an embodiment, the array of interconnect structures 107 may be disposed in a region 105, which may comprise a level/layer of metallization within the device 100. The array of trenches/interconnect structures 107 may be disposed/formed in the same layer 105 during fabrication, such that top surfaces 136 of the interconnect material 106 are disposed directly on an etch stop material 108. In an embodiment, the etch stop material 108 may comprise such materials as silicon carbide, silicon nitride, silicon carbon nitride, however it may be formed from a variety of materials, thicknesses or multiple layers of material, in other embodiments.

The etch stop material/layer 108 may be formed from materials which serve to stop the etching of the interconnect material 106 during fabrication, such as during lithographic, etching and cleaning processing steps, for example, and may be formed by techniques such as PVD, ALD, conventional CVD, low pressure CVD. The etch stop layer 108 can range from about 100 angstroms to about 1000 angstroms, in some embodiments. In an embodiment, the trenches/interconnect structures 107 may be formed utilizing a dual damascene process, in which vias and trenches (not shown) are etched into a dielectric layer, such as the dielectric layer 102. Metal layers, which may comprise interconnect material 106, are then formed over the vias and trenches. This process can be repeated to achieve interconnection, through the trenches and vias, of multiple layers of metallization within the device 100.

Figure 1B:
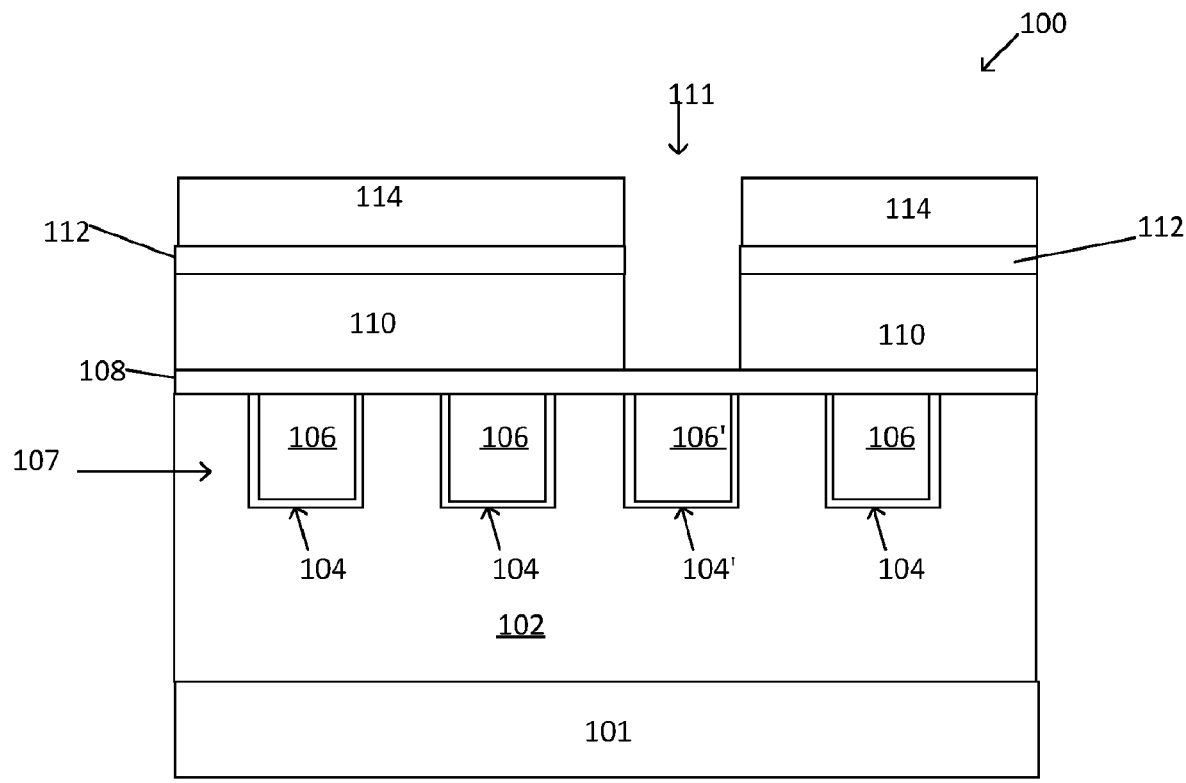
Figure 1C:
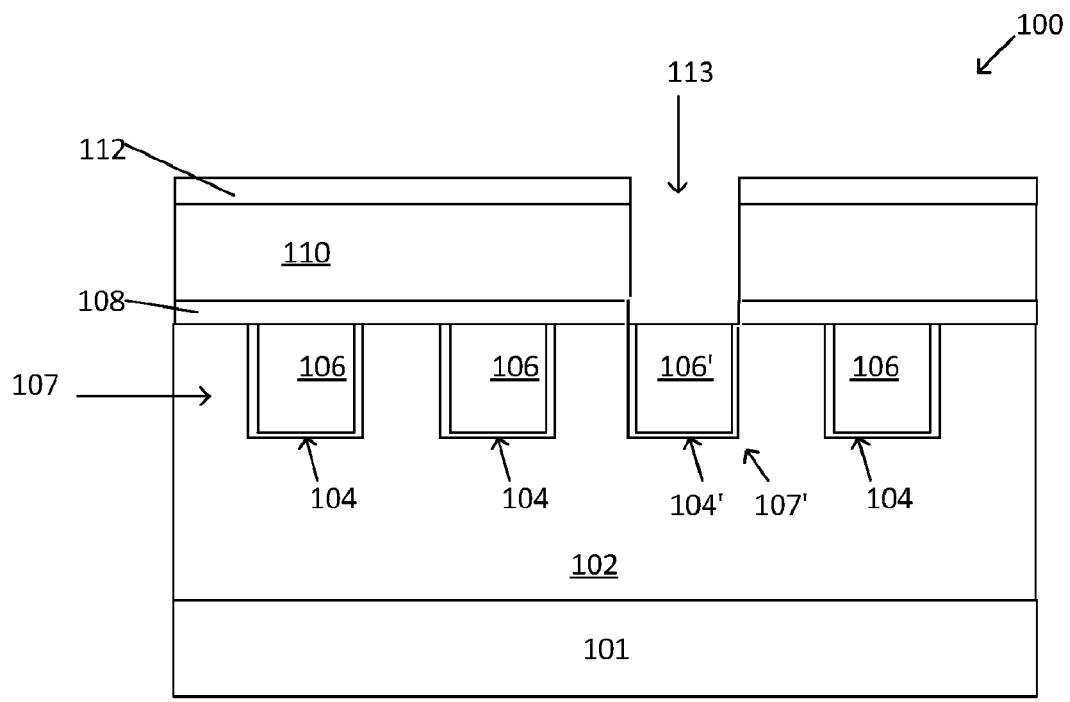
Figure 1D:
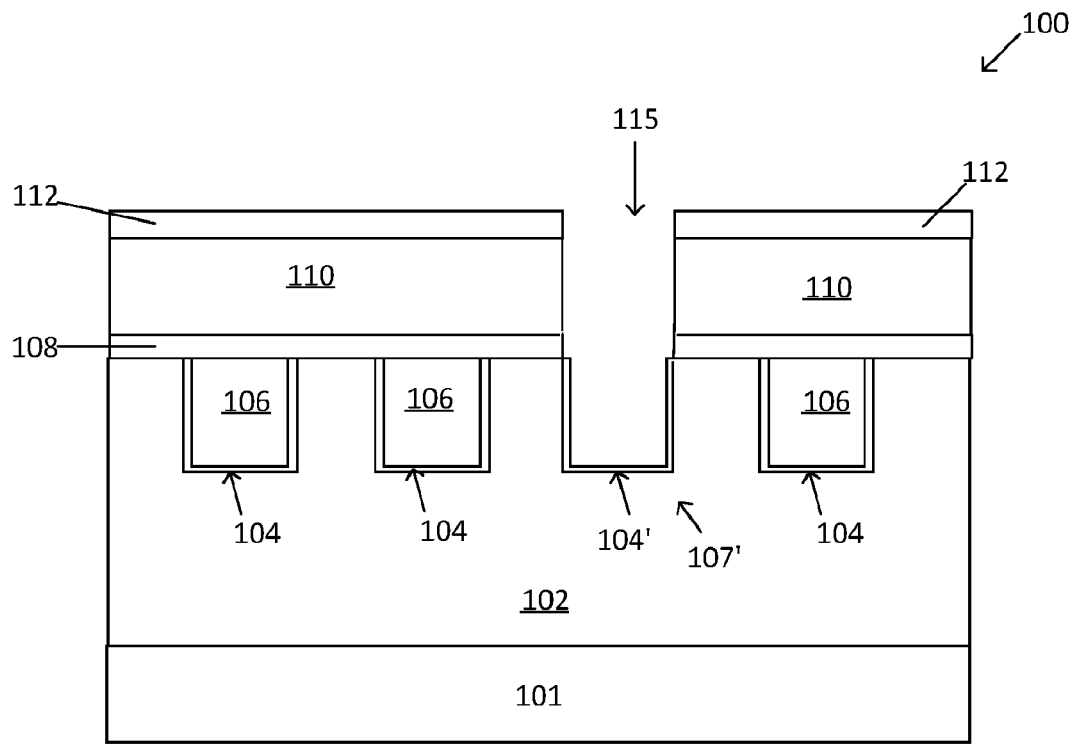

In FIG. 1b, a patterning stack, which may comprise a hard mask material 110 disposed on the etch stop 108, an anti-reflective coating (ARC) 112 disposed on the hard mask 110, and a photoresist material 114 disposed on the ARC material 112, may be employed to pattern the etch stop 108 and underlying interconnect material 106' of a trench structure 107', in an embodiment. An opening 111 may be formed in the patterning stack above a trench structure 107', and then a portion of the etch stop 108 may be removed by utilizing an etch stop removal process 113, such as a dry and/or wet etch process, for example (FIG. 1c). The interconnect material 106' may then be removed from the trench structure 107', the utilizing any suitable removal process, such as removal process 115, in an embodiment, wherein the liner 104' remains in the trench 107' (FIG. 1d). In an embodiment, the removal process 115 may comprise a selective etch process, wherein an etchant may comprise a high etch rate for the interconnect material 106', but may comprise a low to negligible etch rate for the liner material 104'. In an embodiment, the liner 104' may comprise a titanium liner, and the interconnect material 106' may comprise copper, wherein the etchant may be selectively remove copper and not titanium. In another embodiment, the interconnect material 106' may comprise tungsten, and the liner 104' may comprise titanium nitride, wherein the etchant may selectively remove tungsten, and not remove titanium nitride.

Figure 1E:
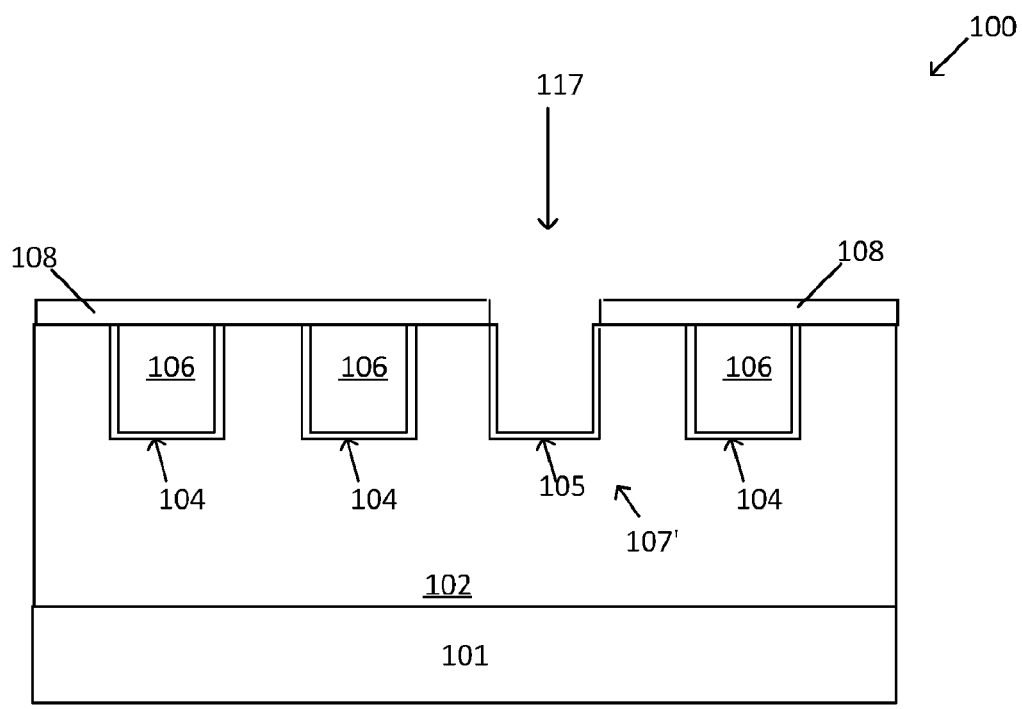
Figure 1F:
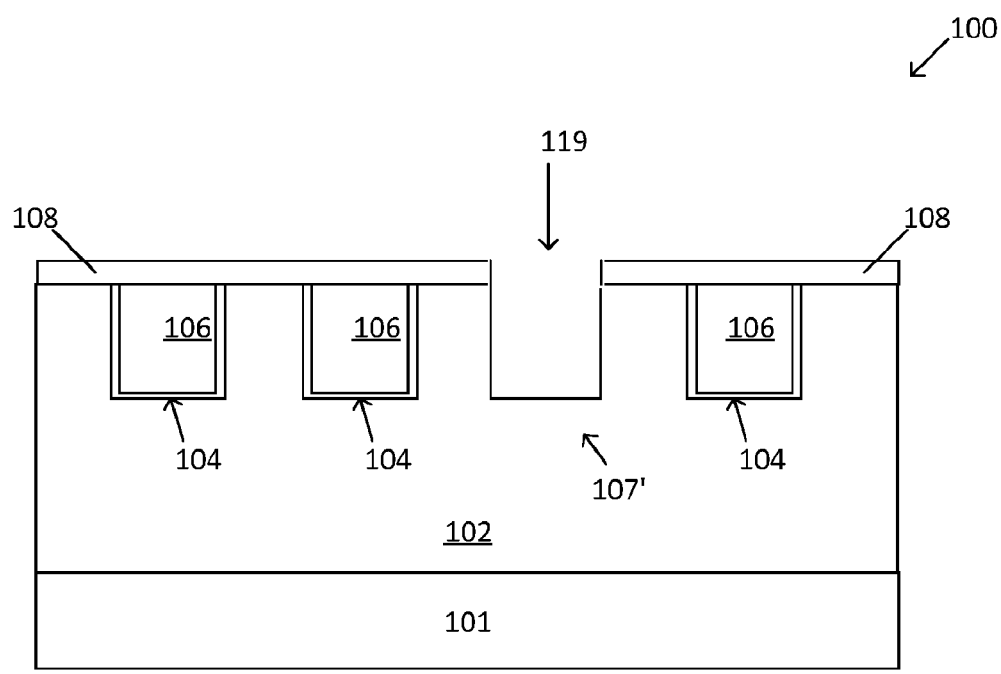

In an embodiment, a treatment 117 may be performed to modulate/adjust a resistance value of the liner 104', to form a resistance adjusted liner 105, which may comprise a thin film resistor 105 (FIG. 1e). For example, a plasma treatment 117 may be performed, wherein a resistance of the liner 104' may be modulated by the application of any suitable plasma process to produce a resistance adjusted liner 105, which may comprise a thin film resistor 105.

Figure 1G:
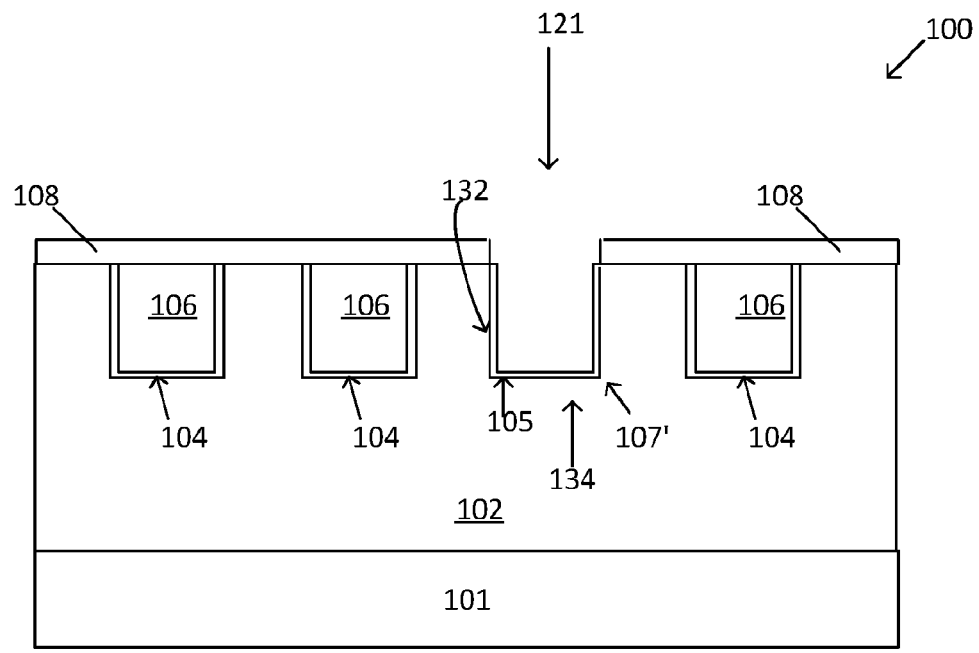

In another embodiment, the treatment 117 may comprise a process which may provide a dopant species to incorporate into the thin film resistor 105, wherein the dopant species may comprise any suitable dopant species, for example, such as phosphorus or boron, which may be impregnated into the liner material 104' to produce a thin film resistor 105. In another embodiment, the liner 104' may be removed from the trench 107' (FIG. 10 by a removal process 119, and a second liner 105 may be formed on the sidewalls 132 and bottom portion 134 of the trench 107' (FIG. 1g). In an embodiment, the second liner 105 may comprise a thin film resistor 105, wherein the material selection/composition of the thin film resistor 105 may be tailored depending upon the requirements of the particular resistor design/value.

Figure 1H:
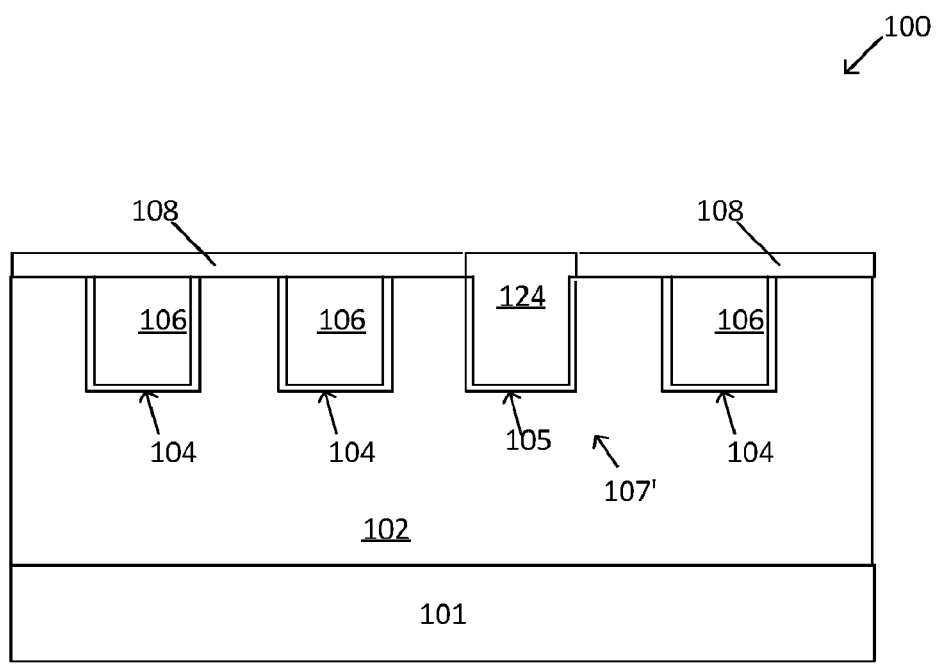
Figure 1I:
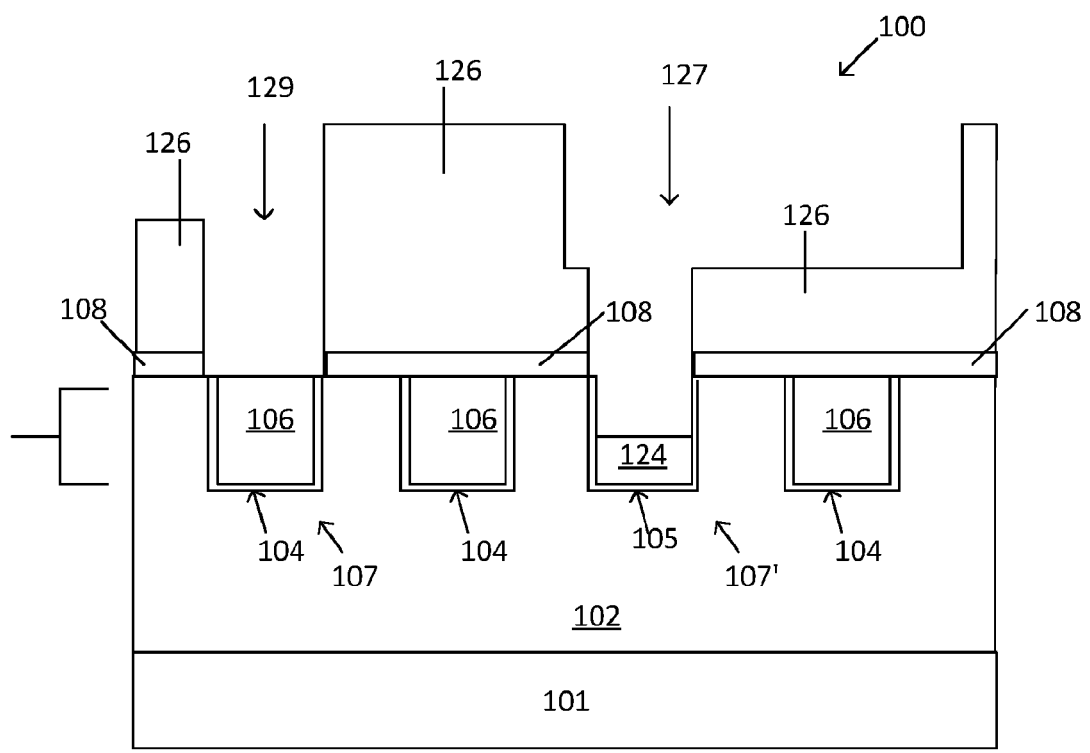

In an embodiment, a dielectric material 124 may be formed in the trench 107' and on the resistor 105 (FIG. 1h). The dielectric material 124 may comprise an ILD, in an embodiment, but may comprise any suitable dielectric material, according to the application. The dielectric material 124 may be disposed directly on the thin film resistor/second liner 105, and may be disposed within the trench 107'. In an embodiment, a portion of the dielectric material 124 may be removed from the trench (FIG. 1i). A first opening 127, which may comprise a via and trench in an embodiment, may be formed/patterned in a second dielectric layer 126, wherein the first opening 127 may comprise a damascene trench and via structure, and may be formed adjacent the trench 107', and the dielectric material 124, in an embodiment.

In an embodiment, a second opening 129 may be formed in the second dielectric layer 126, adjacent a trench 107, wherein the trench 107 comprises the interconnect material 106. In an embodiment, the trench 107 comprises a first trench 107 with the interconnect material 106 disposed within the trench 107 and disposed on a first liner 104, wherein the first liner 104 comprises a barrier layer 104, and does not comprise a thin film resistor. In an embodiment, the first liner 104 may comprise different materials than the second liner 105, since the first liner 104 comprises a barrier layer, in an embodiment, and the second liner 105 comprises a thin film resistor. Additionally, the first and second liners 104, 105 may comprise different resistance values from each other, with the thin film resistor 105 being much less conductive than the first liner 104. In an embodiment, the resistance values of the thin film resistor may comprise between about 2 micro Ohm-cm to greater than about 20000 micro Ohm-cm.

Figure 1J:
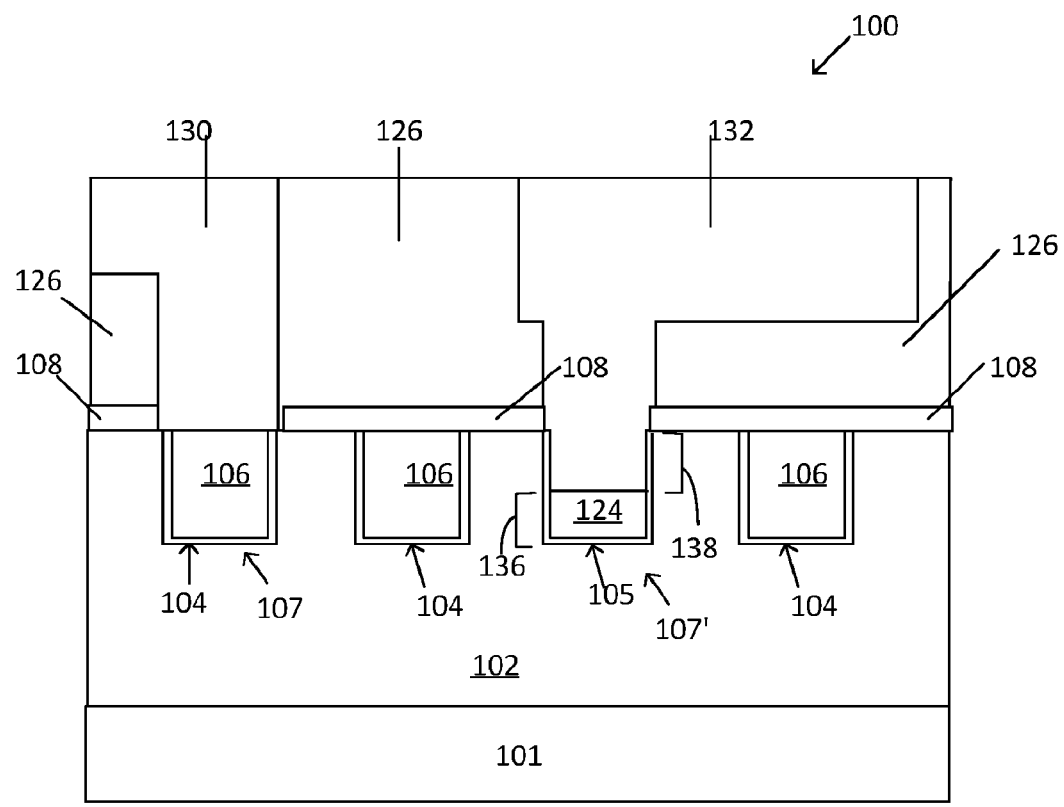

In an embodiment, the trench 107' may comprise a second trench 107', wherein the second trench 107' does not comprise the interconnect material 106, and wherein the second liner 105 comprises a thin film resistor 105. In an embodiment, a first contact structure 130 may be disposed on a top surface of the interconnect material 106 disposed in the first trench 107, and may be electrically coupled with the interconnect material 106 (FIG. 1j). In an embodiment, a second contact structure 132 may be disposed on a top surface of the dielectric material 124 that is disposed within the second trench 107'. In an embodiment, the dielectric material 124 may be disposed in a first portion 136 of the second trench 107' and a portion of the second contact structure 132 may be disposed in a second portion 138 of the trench 107'.

In an embodiment, the second contact structure 132 may extend a distance of about ⅓ to about ½ into the depth of the second trench 107', but may extend other distances into the second contact 132 in other embodiments. The first contact 130 may not extend any appreciable distance into the first trench 107, since it makes contact to the surface of the interconnect material 106 and not to a thin film resistor. In an embodiment, the contact material of the first and second contact structures 130, 132 may comprise copper, and/or tungsten and alloys thereof.

In an embodiment, a portion of the second contact structure 132 may be physically disposed on the second liner/thin film resistor 105 in the second trench 107', and may be electrically coupled with the thin film resitor 105. In an embodiment, the first liner 104 and the second liner 105 may comprise different materials, since the second liner 105 is treated to adjust the resistance value of the resistor material. Additionally, there may be structural differences (grain boundaries, intermetallics, etc) that may be present in the thin film resistor 105 due to the treatment/adjustment performed in FIG. 1e, for example.

In an embodiment, the thin film resistor 105 may comprise different concentrations/chemical composition of materials than the first liner 104 of the first trench 107, such as different percentages of elements within the resistor film 105 as compared with the first liner 104. In an embodiment, the thin film resistor 105 may comprise such materials as tantalum, titanium, nitrogen, tantalum, titanium, copper, titanium nitride, tantalum oxide, tungsten, cobalt, ruthenium, nickel, silver, aluminum, and their alloys, for example, but other materials may be utilized according to the required resistance values for a particular application, which may comprise about 100 Ohm to about 10 MOhm, in an embodiment. In an embodiment, the thin film resistor 105 may comprise similar materials as the first liner, but in different percentages, due to the resistor adjustment process. In an embodiment, the resistor 105 may be formed in any number of trench structures 107, according to the embodiments herein, within an array of trench structures 107, depending upon the particular design requirements of the device 100.

Figure 2A:
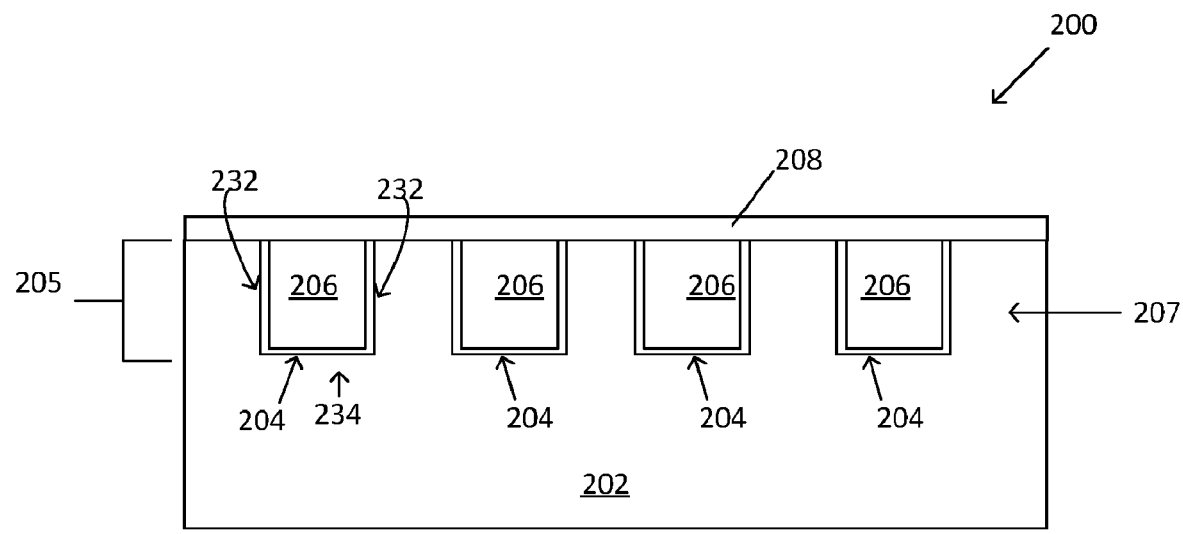
FIG. 2a-2k represent cross-sectional views of structures according to embodiments.
Figure 2A:
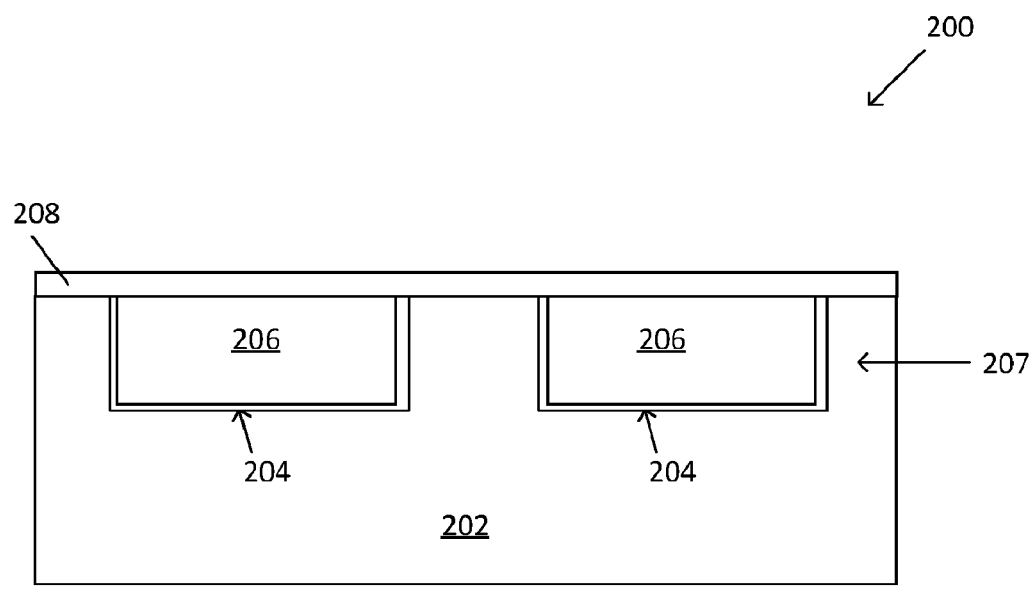

In another embodiment, a plurality of trenches/interconnect structures 207 may be disposed adjacent to each other within a dielectric layer 202 of a device 200 (FIG. 2a, showing a cross-sectional view, perpendicular to the interconnect material 206). In an embodiment, the individual ones of the plurality of trenches 207 may comprise a liner 204, and an interconnect material 206 within each of the individual ones of the plurality of trenches 207. The liner 204 and interconnect material 206 may comprise any of the liner materials and interconnect materials, respectively, previously described herein. In an embodiment, each of the individual trenches 207 may comprise sidewall portions 232 and a bottom portion 234. In some embodiments, the liner 204 may be at least partially conductive and may be disposed between the dielectric layer 202 and the interconnect material 206.

Figure 2B:
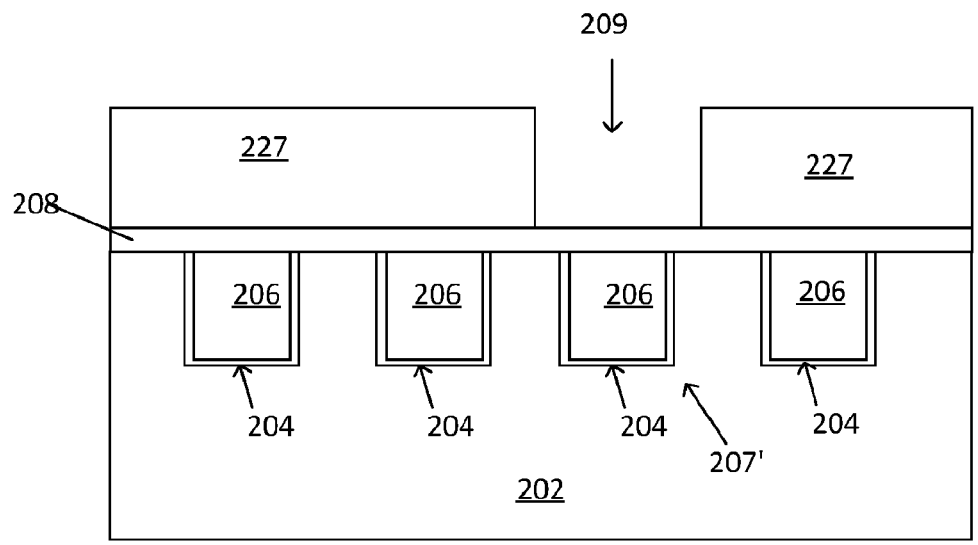
Figure 2B:
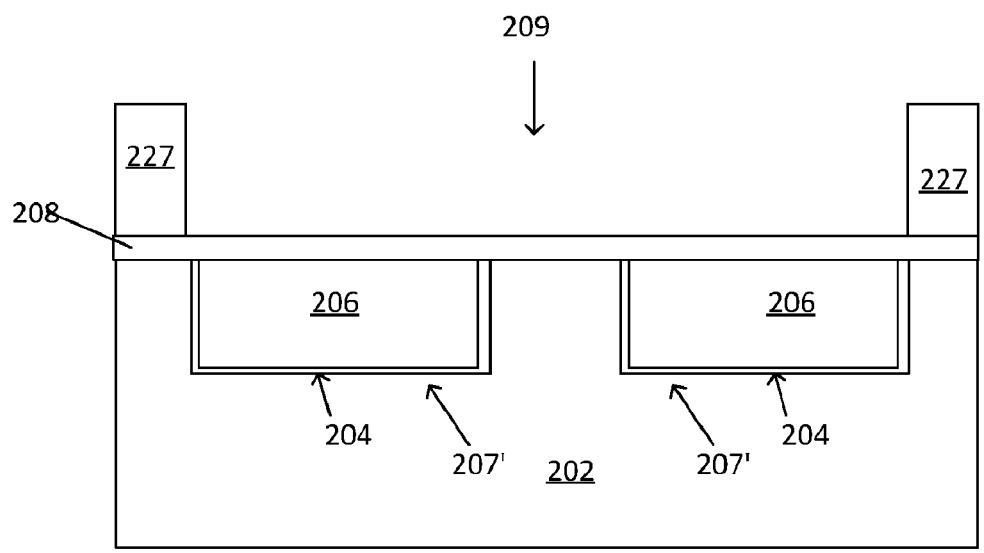

The liner 204 may be disposed on at least a portion of the sidewalls 232 and on at least a portion of the bottom portion 234 of the trench structures 207. An etch stop material 208 may be disposed on top surfaces of the interconnect material 206. FIG. 2a' depicts a cross-sectional view parallel to the interconnect material 206, wherein trench structures 207 are disposed in the dielectric material 202, and the etch stop material 208 is on the top surface of the trench structures 207. FIGS. 2b', 2c' and the like described subsequently herein, similarly refer to cross sectional views parallel to the interconnect material 206.

Figure 2C:
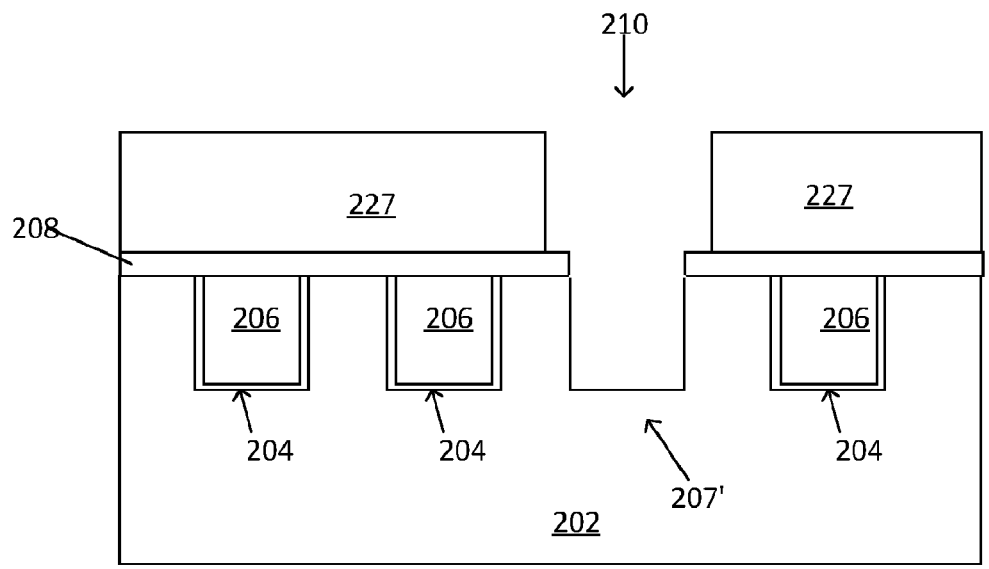
Figure 2C:
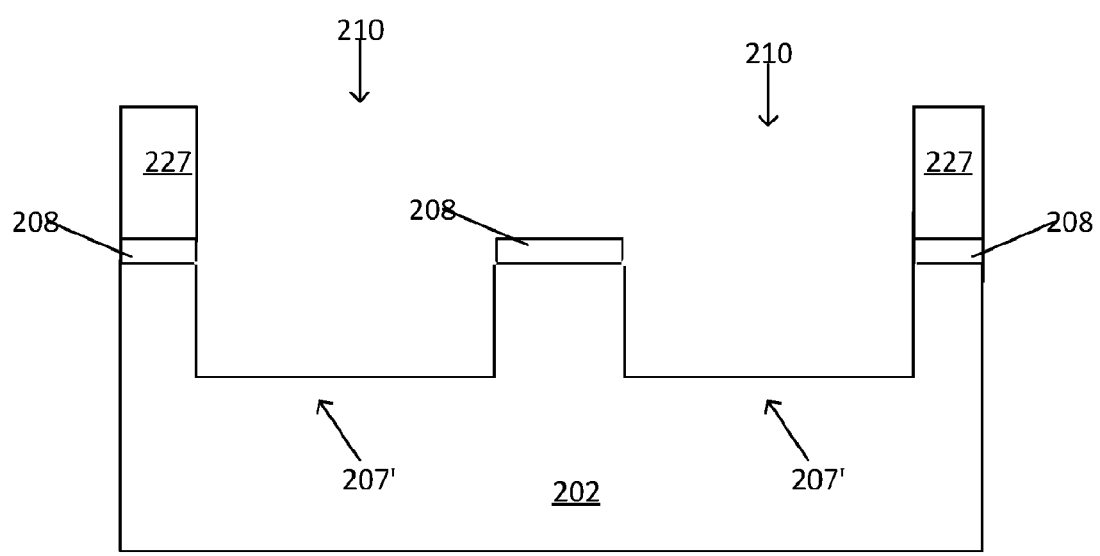
Figure 2D:
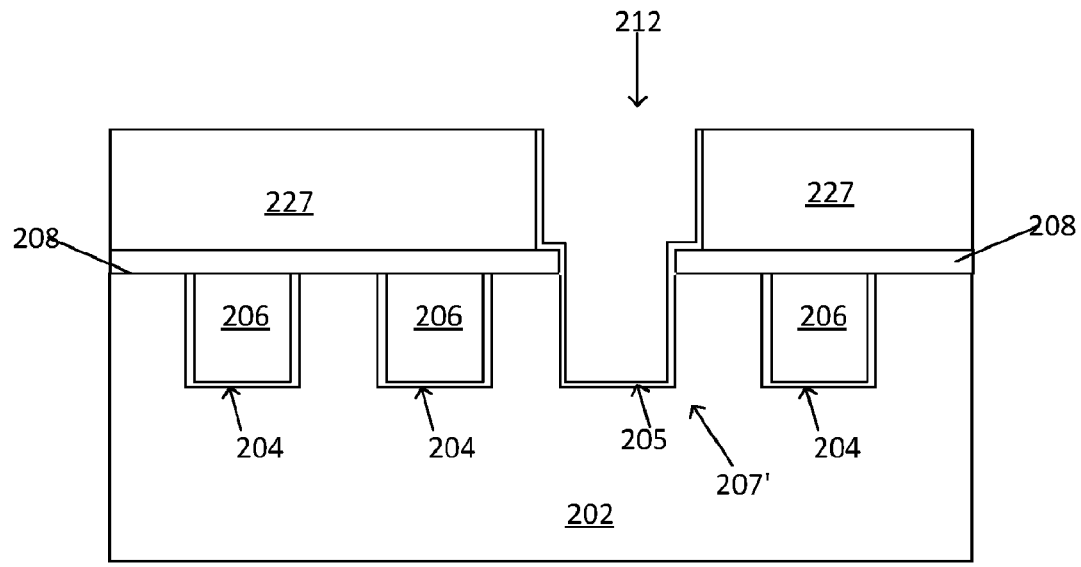
Figure 2D:
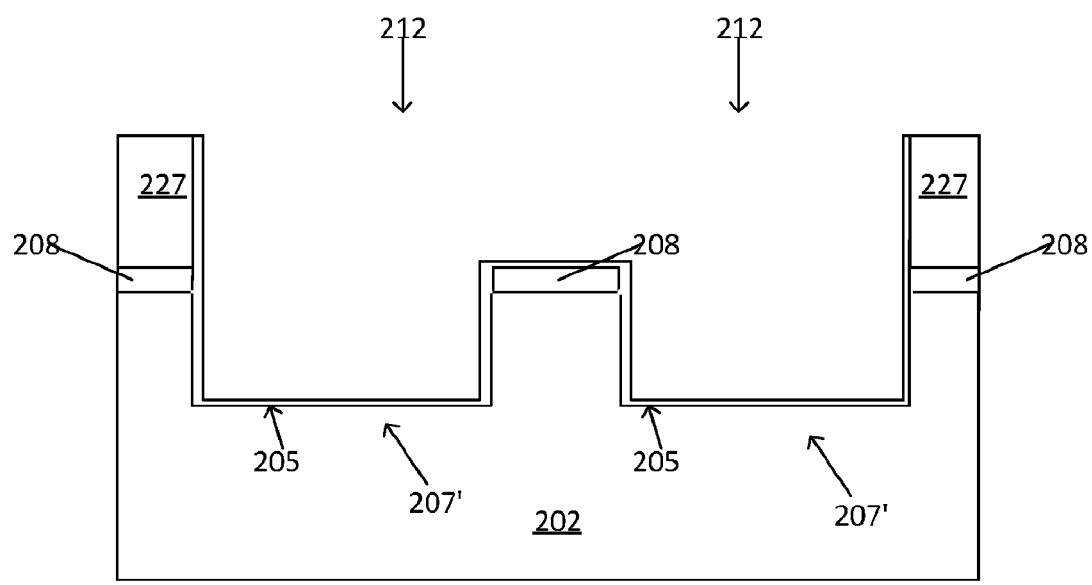

FIGS. 2b-2c depict patterning and formation of an opening perpendicular to the interconnect material 206, and FIGS. 2b'-2c' depict the fabrication of the opening parallel to the interconnect material 206, wherein a mask material 227 is employed. Trench opening 209 and then via opening 210 (which may comprise a damascene structure 210) are formed, wherein the interconnect material 206 and the liner 204 are removed from the trench 207'. A thin film resistor material/structure 205, which may comprise any of the thin film resistor materials/fabrication techniques previously described herein, may be formed in the opening 210, wherein a resistor deposition process 212 may be employed (FIGS. 2d, 2d'). The resistor material 205 may comprise any suitable thickness, and may comprise a thickness of between about 1 nm to about 10 nm, in an embodiment. The resistance value of the thin film resistor 205 may comprise any suitable value, depending upon the particular design requirements. The thin film resistor 205 may line the sidewalls and bottom portion of the trench 207'.

Figure 2E:
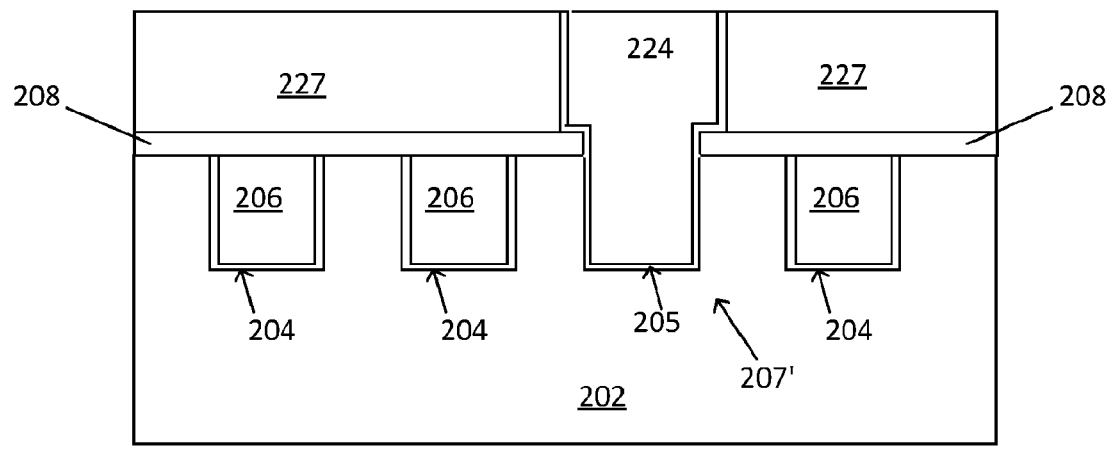
Figure 2E:
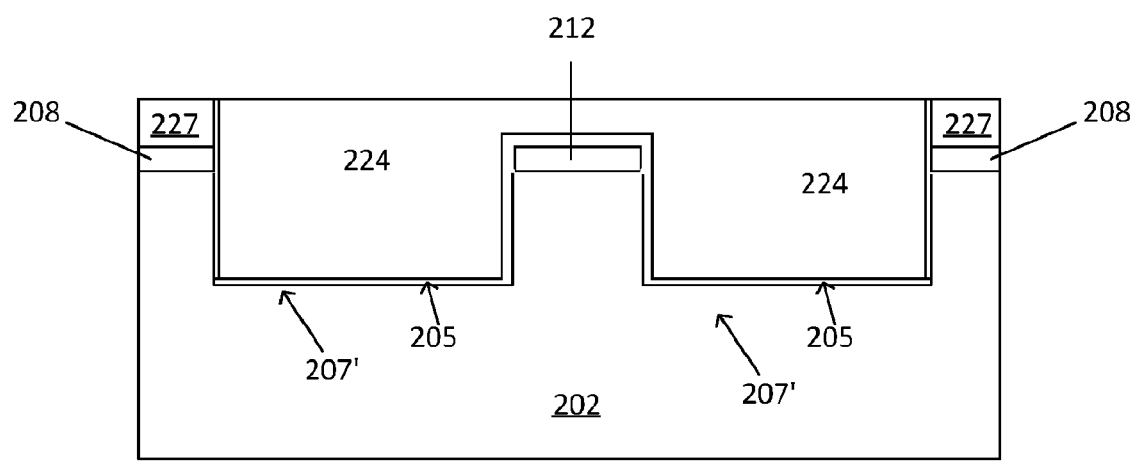
Figure 2F:
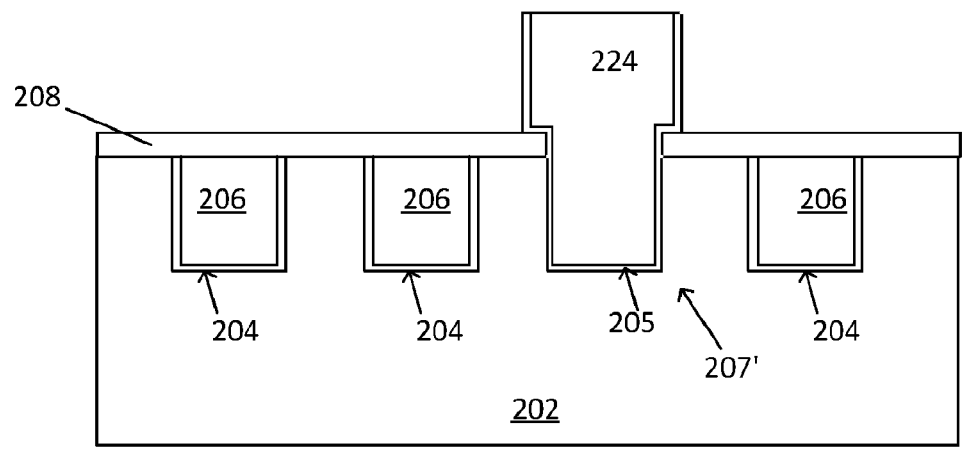
Figure 2F:
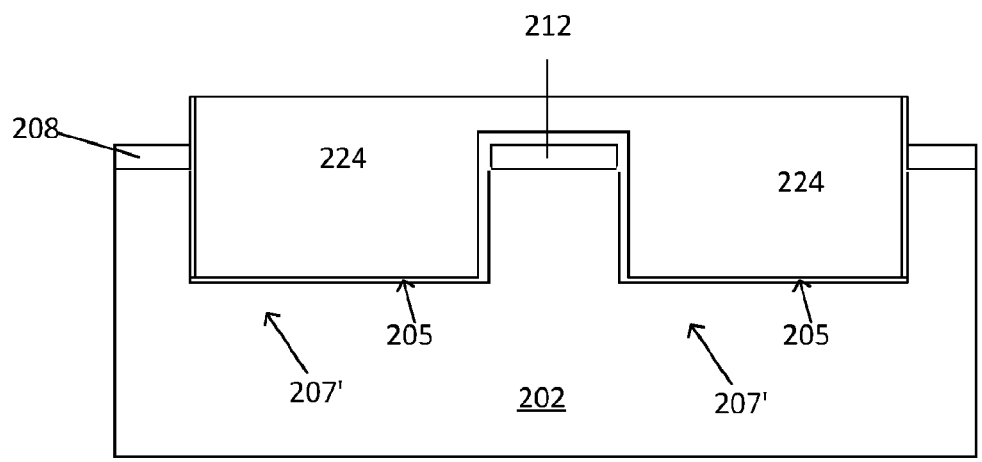
Figure 2G:
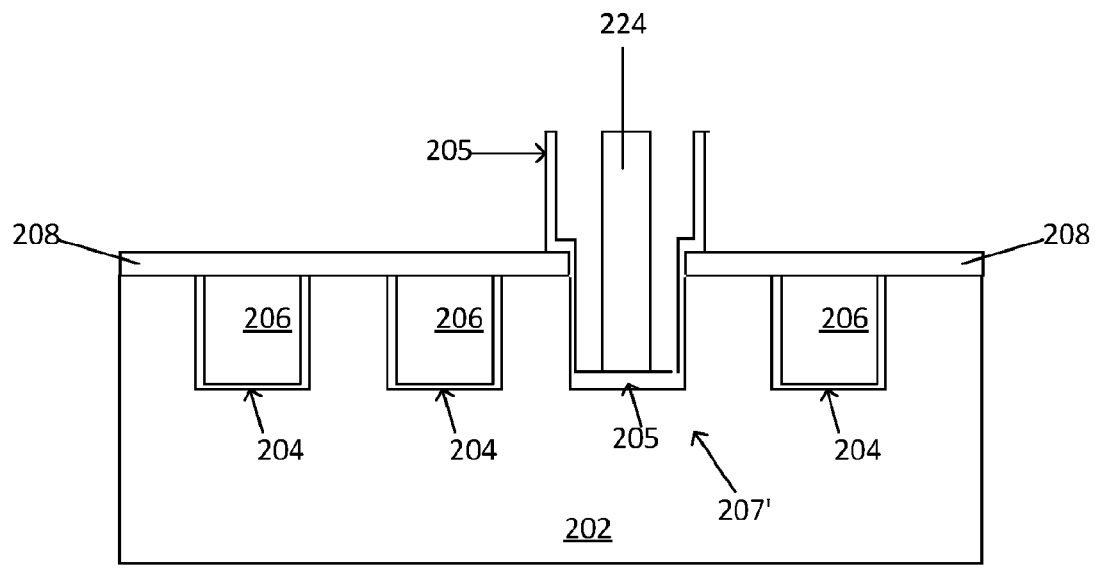
Figure 2G:
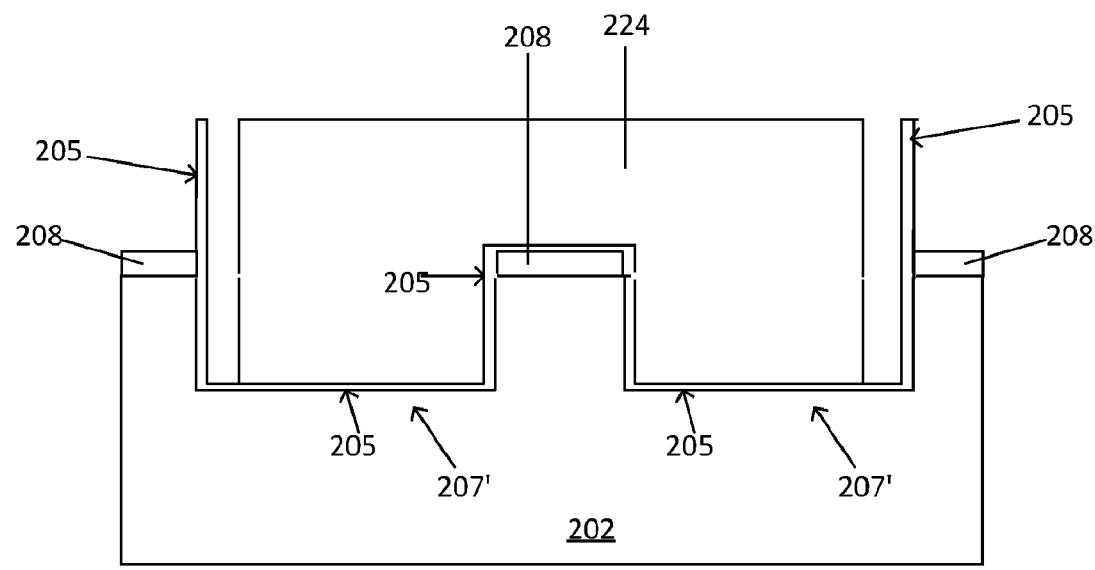
Figure 2H:
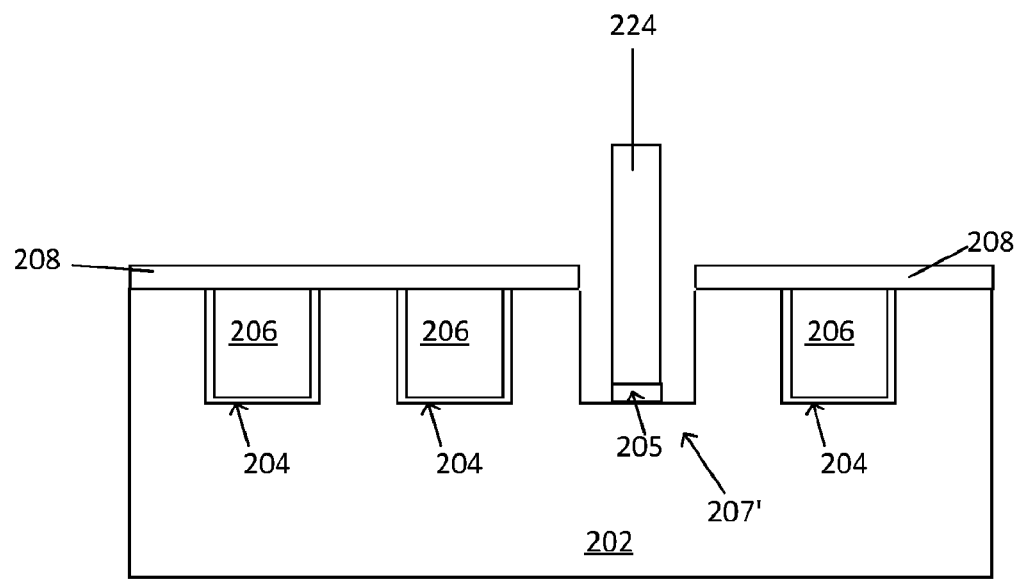
Figure 2H:
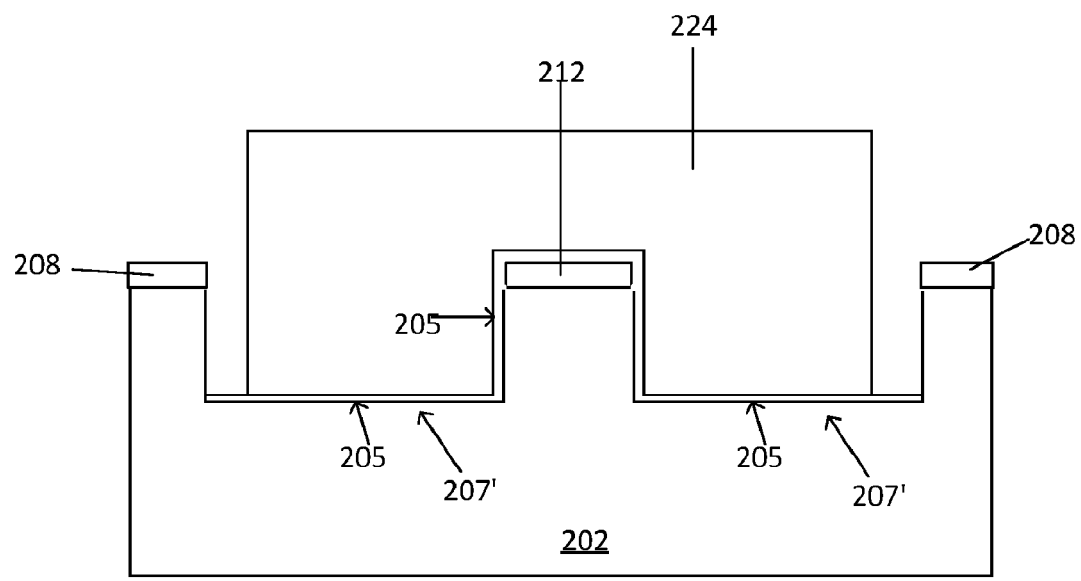

A dielectric material 224 may be formed in the trench 207' and on the thin film resistor structure 205 (FIGS. 2e, 2e'), and then the hard mask 227 may be removed (FIG. 2f, 2f). A portion of the dielectric material 224 may be removed/trimmed from a sidewall portion of the thin film resistor 205 (FIGS. 2g, 2g') using any suitable removal process, such as an etch process, for example. The thin film resistor 205 may optionally be trimmed using a laser trim process, for example, wherein the sidewall portions of the resistor 205 may be removed, and the bottom portion of the resistor 205 remains under the dielectric material 224 (FIGS. 2h, 2h'). The trimming of the resistor 205 may be performed to adjust the resistance value of the resistor 205 to a desired value for a particular application.

Figure 2I:
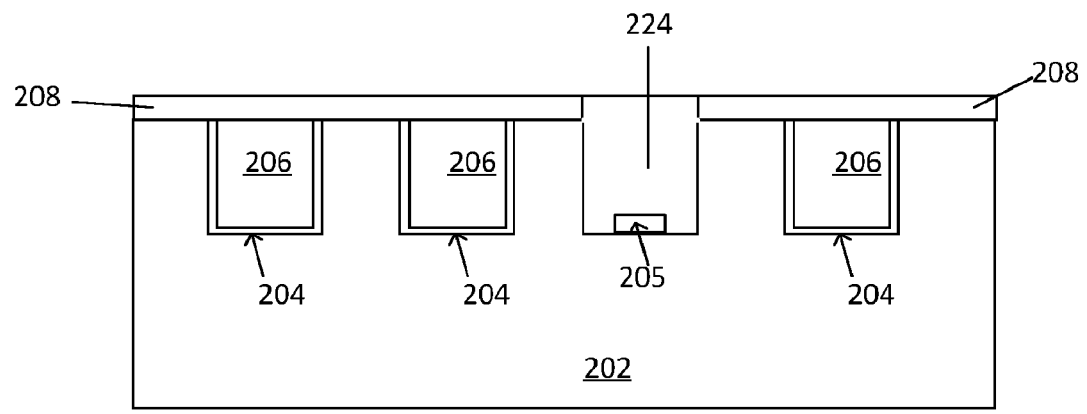
Figure 2I:
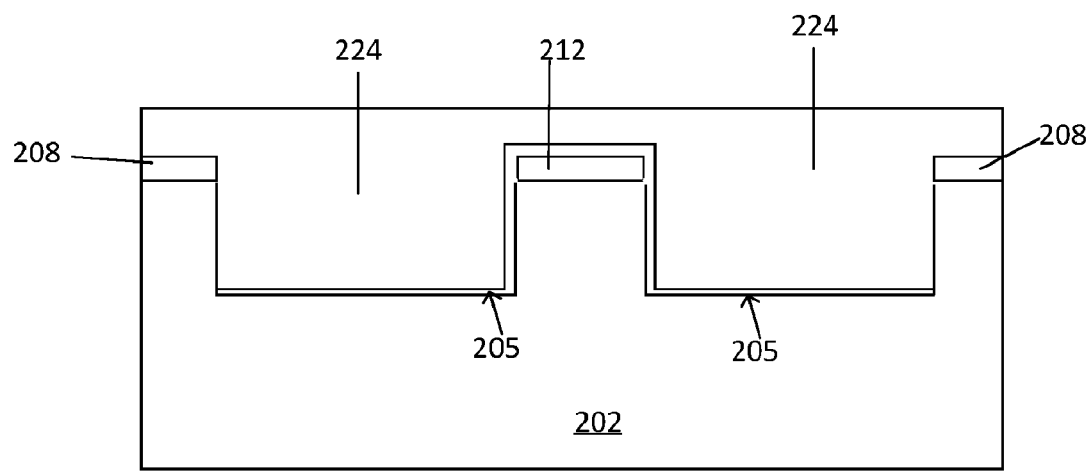
Figure 2J:
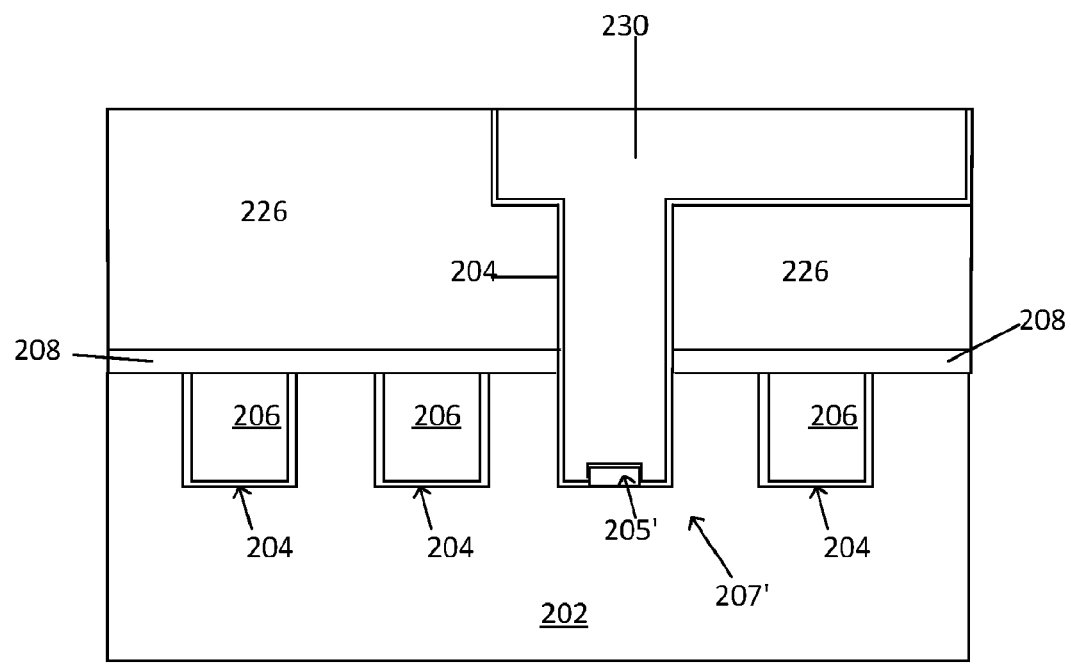
Figure 2J:
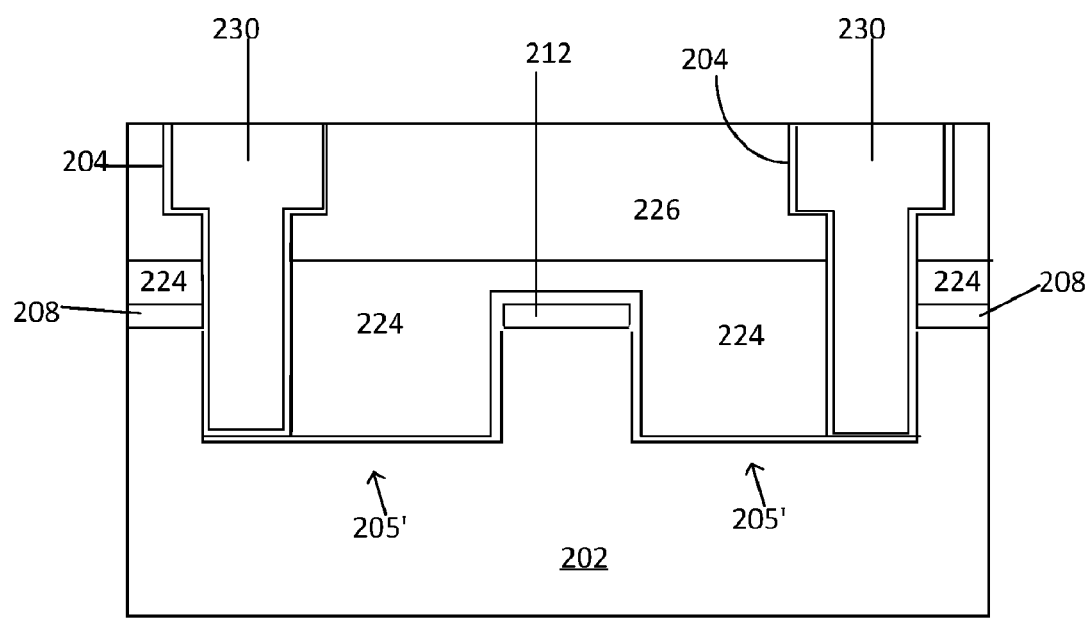

After the dielectric material 224 and resistor 205 have been trimmed, a second dielectric material may be formed to fill in the space between the dielectric 224 and the sidewall of the trench 207' (FIG. 2i, 2i'). The dielectric material 224 may then be polished/planarized by utilizing a chemical mechanical polishing (CMP) process, for example, to substantially achieve planarity with the etch stop layer 208, in an embodiment. In an embodiment, a contact structure 230 may be disposed on a top surface of the trimmed resistor 205 (subsequent to the removal of the dielectric material 224 from the trench 207') that is disposed within and on the bottom portion of the trench 207' (FIGS. 2j, 2j'). In an embodiment, the contact material of the contact structure 230 may comprise copper, and/or tungsten and alloys thereof, and may be physically and electrically coupled with the trimmed resistor 205.

Figure 2K:
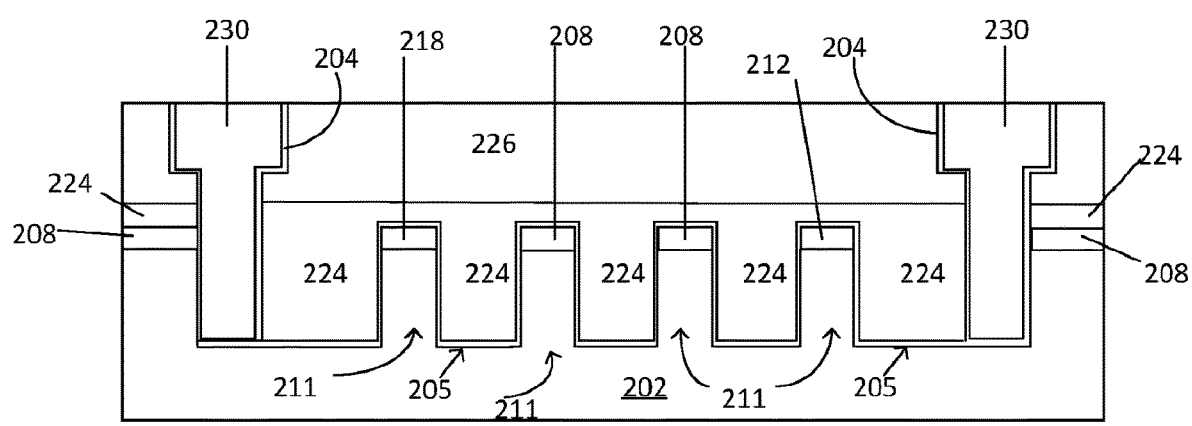

The trim process serves to reduce a width or a length of the resistor 205 in order to increase resistance, if necessary for design requirements. Additionally, since the thin film resistor 205 is formed around the topography of the originally patterned trench (for example, FIG. 2k depicts an undulating resistor structure 205 around the patterned dielectric), the sheet resistance of the thin film resistor 205 may be increased by about 3 to about 50 times that of a non-undulating resistor 205. In an embodiment, the resistor 205 may be formed around multiple plug structures 211 disposed beneath the etch stop material 208. In an embodiment, the amount of resistance increase can be controlled by changing the conformality of the resistor deposition, wherein a less conformal desposition increases the resistance of the resistor 205, more than a deposition comprising greater conformality.

Figure 3:
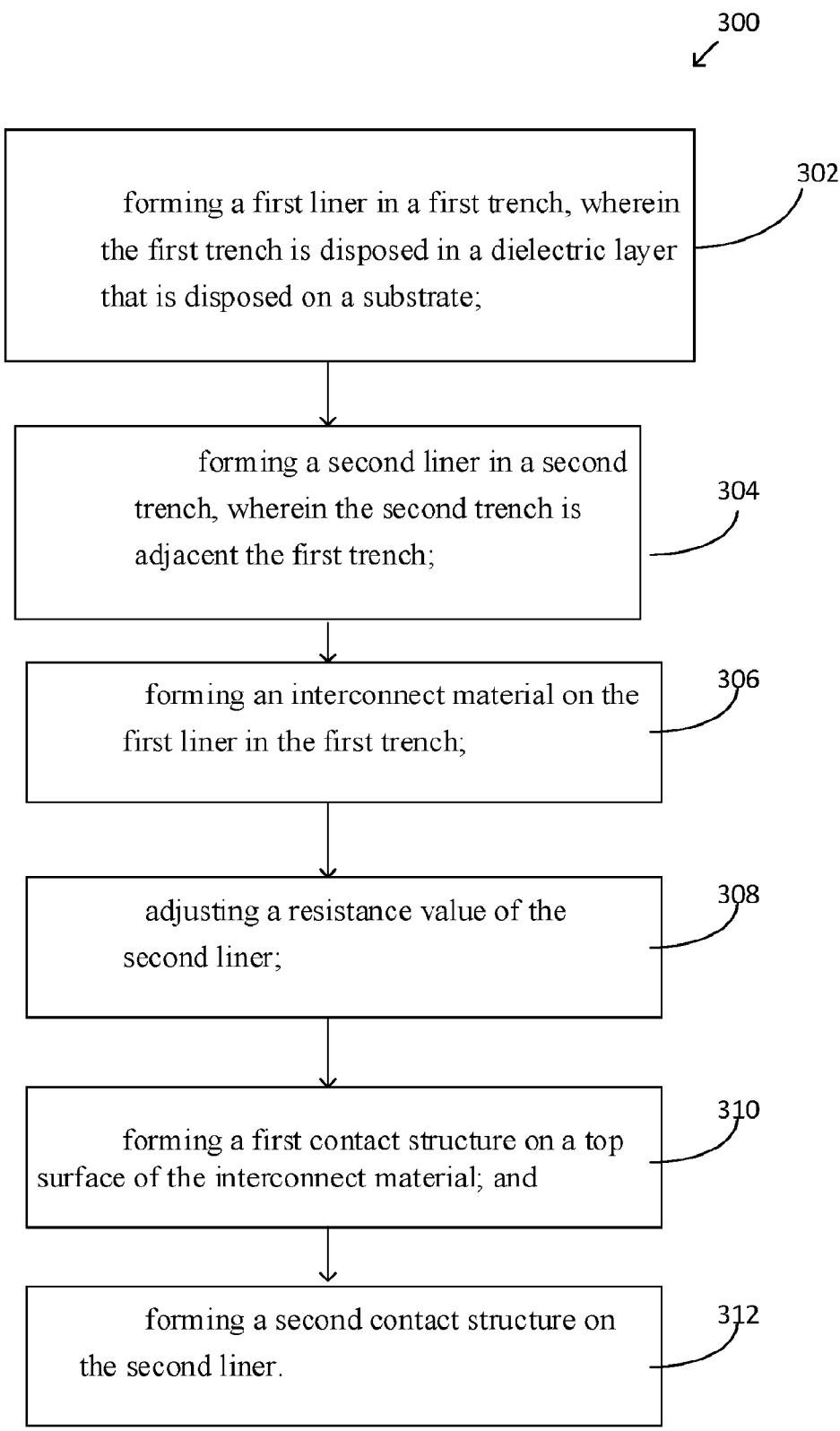
FIG. 3 represents a flow chart of a method according to embodiments.

FIG. 3 depicts a method 300 according to embodiments herein. At step 302, a first liner may be formed in a first trench, wherein the first trench is disposed in a dielectric layer that is disposed on a substrate. At step 304, a second liner may be formed in a second trench, wherein the second trench is adjacent the first trench. The first and second trenches may be a portion of an array of trenches, which may be disposed in the same metal layer within a device. In an embodiment, the first and second trenches may be substantially parallel with one another, and the liner material may comprise an interconnect barrier layer.

At step 306, an interconnect material may be formed on the first liner in the first trench. The interconnect material may comprise copper and/or copper alloys, in an embodiment. At step 308, a resistance value of the second liner may be adjusted. The resistance value may be adjusted by various methods, such as by removing the second liner and replacing it with a thin film resistor comprising a desired resistor value. In another embodiment, the resistance value of the second liner may be adjusted by applying a plasma treatment and/or by doping the second liner with a dopant species in order to achieve a desired resistance value.

At step 310, a first contact structure may be formed on a top surface of the interconnect material. At step 312, a second contact structure may be formed on the second liner. In an embodiment, a dielectric material may be disposed on a top portion of the second liner, and the second contact may be physically and electrically coupled with a sidewall portion of the second liner. In another embodiment, the second contact structure may be physically and electrically coupled with a trimmed thin film resistor/second liner that is disposed on a bottom portion of the second trench.

The embodiments herein enable the fabrication of thin film resistors using interconnect liner materials. Thin film resistors of the embodiments herein are patterned in the same layer as the interconnect structures, which avoids added topography and requires zero metal density in surrounding layers, which in turn minimizes capacitance and shorting risks. Patterning the thin film resistor in the same layer as the interconnect structure reduces topography in the interconnect region, improves interconnect density near the thin film resistor region, and allows for the use of non-dry etch-able materials as thin film resistors. Dual damascene patterning may be employed wherein an additional mask may be used to remove the bulk interconnect material selectively to expose the interconnect liner in desired regions where a resistor may be formed. The contact via above the thin film resistor may land on the liner material/resistor, with no additional changes required from a typical process flow.

The microelectronic device structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the device/die structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

The embodiments herein may include portions of die/device structures, which may comprise any type of integrated circuit die/device. In one embodiment, the die may include a processing system (either single core or multicore). For example, an integrated circuit (IC) die may comprise a microprocessor, a graphics processor, a signal processor, a network processor, a chipset, etc. In one embodiment, the IC die 120 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices/die.

Conductive interconnect structures may be disposed on a side(s) of a die/device, and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder (e.g., in the form of balls or bumps) may be disposed on the terminals of the substrate and/or die/device, and these terminals may then be joined using a solder reflow process. Of course, it should be understood that many other types of interconnects and materials are possible (e.g., wirebonds extending between a die and a substrate).

The terminals on a die may comprise any suitable material or any suitable combination of materials, whether disposed in multiple layers or combined to form one or more alloys and/or one or more intermetallic compounds. For example, the terminals on die may include copper, aluminum, gold, silver, nickel, titanium, tungsten, as well as any combination of these and/or other metals. In other embodiments, a terminal may comprise one or more non-metallic materials (e.g., a conductive polymer). The terminals on a substrate may also comprise any suitable material or any suitable combination of materials, whether disposed in multiple layers or combined to form one or more alloys and/or one or more intermetallic compounds.

For example, the terminals on substrate may include copper, aluminum, gold, silver, nickel, titanium, tungsten, as well as any combination of these and/or other metals. Any suitable solder material may be used to join the mating terminals of the die and substrate, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter the reflow temperature).

Various die/devices of the embodiments herein may be coupled with a substrate, such as a package substrate. A package substrate may comprise any suitable type of substrate capable of providing electrical communications between a die, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

Figure 4:
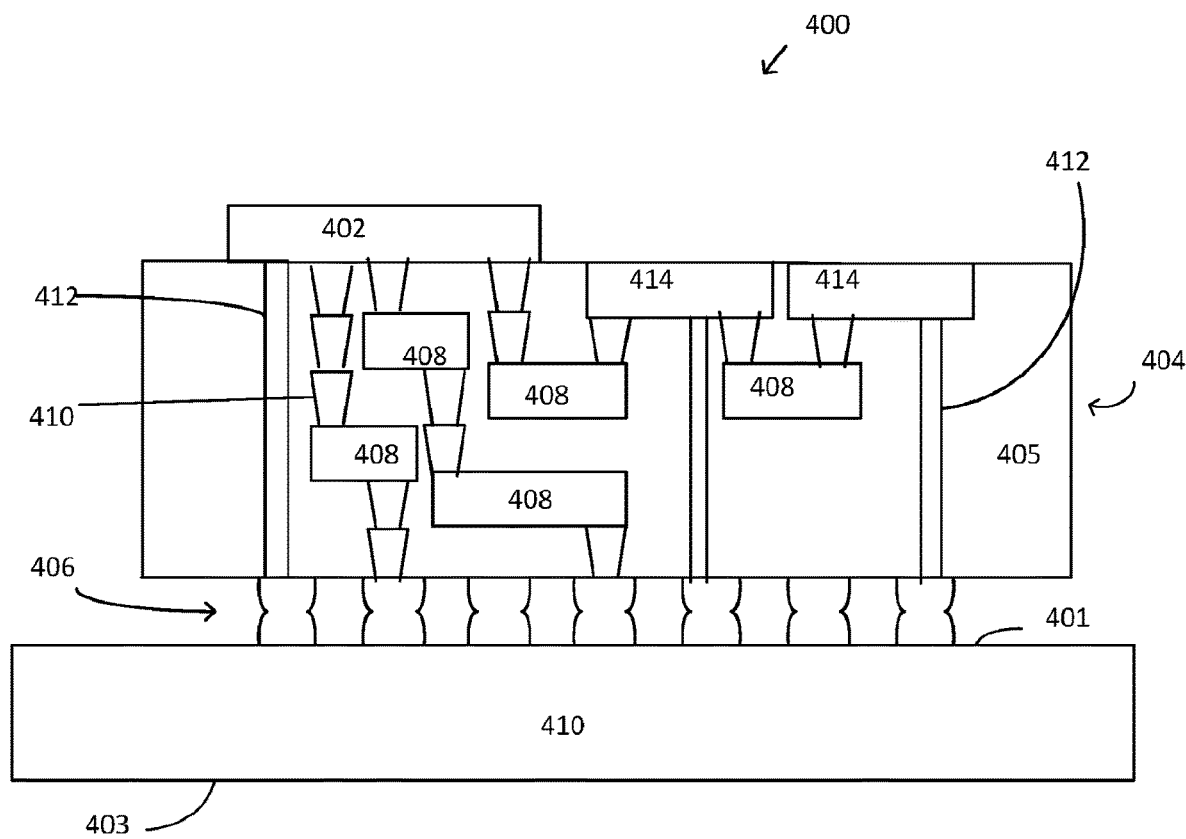
FIG. 4 represents a computer system implementing one or more embodiments.

Turning now to FIG. 4, illustrated is an embodiment of a computing system 400. The system 400 includes a mainboard 410, such as a motherboard or other circuit board. Mainboard 410 includes a first side 401 and an opposing second side 403, and various components may be disposed on either one or both of the first and second sides 401, 403. In the illustrated embodiment, the computing system 400 includes a die 402, such as any of the die/device structures of the embodiments herein, disposed on a substrate 404. The substrate 404 may comprise an interposer 404, for example. The substrate 404 may comprise various levels of conductive layers 414, 408, for example, which may be electrically and physically connected to each other by via structures 410. The substrate 404 may further comprise through substrate vias 412. Dielectric material 405 may separate/isolate conductive layers from each other within the substrate 404. Joint structures 406, may electrically and physically couple the substrate 404 to the board 410. The computing system 400 may comprise any of the embodiments described herein.

System 400 may comprise any type of computing system, such as, for example, a hand-held or mobile computing device (e.g., a cell phone, a smart phone, a mobile interne device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 410 may comprise any suitable type of circuit board or other substrate capable of providing electrical communication between one or more of the various components disposed on the board. In one embodiment, for example, the mainboard 410 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 410. However, it should be understood that the disclosed embodiments are not limited to the above-described PCB and, further, that mainboard 1010 may comprise any other suitable substrate.

Figure 5:
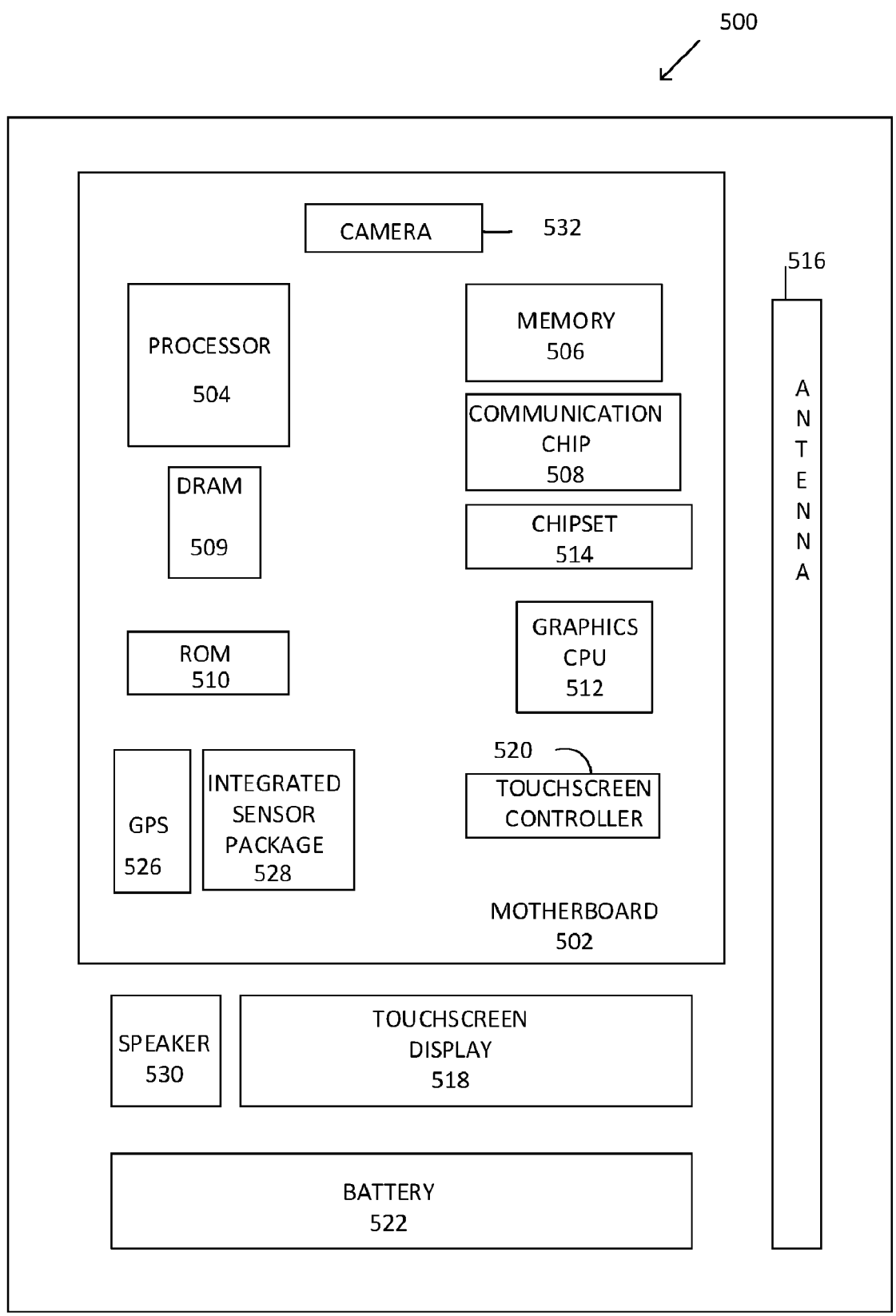
FIG. 5 represents a schematic of a computing device according to embodiments.

FIG. 5 is a schematic of a computing device 500 that may be implemented incorporating embodiments of the package structures described herein. For example, any suitable ones of the components of the computing device 500 may include, or be included in, device/die structures of the various embodiments disclosed herein. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 1108 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, an integrated sensor 528, a speaker 530, a camera 532, compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic device structure comprising: a first trench disposed in a dielectric layer, wherein the dielectric layer comprises a portion of a substrate, and wherein the first trench comprises a first liner disposed on at least a portion of a sidewall of the first trench, and wherein an interconnect material is disposed within the first trench adjacent the first liner; a second trench disposed adjacent the first trench, wherein the second trench comprises a second liner disposed on at least a portion of a sidewall within the second trench; a dielectric material disposed on the second liner within the second trench; and a contact structure physically and electrically coupled to the second liner material in the second trench.

Example 2 includes the microelectronic device structure of example 1, wherein the second liner material comprises a thin film resistor.

Example 3 includes the microelectronic device structure of example 2 wherein the thin film resistor comprises a material selected from the group consisting of tantalum, titanium, tantalum, titanium, copper, titanium nitride, tantalum oxide, tungsten, cobalt, ruthenium, nickel, silver, aluminum, and alloys thereof.

Example 4 includes the microelectronic device structure of example 1 wherein the first liner material comprises an interconnect barrier layer.

Example 5 includes the microelectronic device structure of example 1 wherein the second liner material comprises a dopant species.

Example 6 includes the microelectronic device structure of example 1 wherein the first liner comprises a different material than the material of the second liner.

Example 7 includes the microelectronic device structure of example 1 wherein the second liner comprises an undulating structure.

Example 8 includes the microelectronic device structure of example 1 wherein the second trench does not comprise the interconnect material.

Example 9 is a microelectronic device structure comprising: a substrate; a dielectric layer on the substrate; an array of trenches disposed in the dielectric layer, wherein a first trench and a second trench are adjacent each other, and wherein an interconnect material is disposed within the first trench and is disposed on a first liner disposed within the first trench, and wherein the second trench comprises a second liner that is disposed within the second trench, and wherein the second trench does not comprise the interconnect material; a first contact structure disposed on a top surface of the interconnect material; and a second contact structure disposed on the second liner within the second trench.

Example 10 includes the microelectronic device structure of example 9 wherein a dielectric material is disposed on the second liner within the second trench.

Example includes the microelectronic device structure of example 10 wherein the second contact structure is disposed on the dielectric material.

Example 12 includes the microelectronic device structure of example 9 wherein the first liner and the second liner comprise different materials from each other.

Example 13 includes the microelectronic device structure of example 9 wherein the interconnect material comprises at least one of copper titanium nitride, tantalum oxide, tungsten, cobalt, ruthenium, nickel, silver, or aluminum, or combinations thereof.

Example 14 includes the microelectronic device structure of example 9 wherein the second liner comprises an undulating structure around the dielectric topography.

Example 15 includes the microelectronic device structure of example 9 wherein the second liner is disposed on a bottom portion of the trench, and not on a sidewall portion of the trench.

Example 16 includes the device structure of example 9, wherein the second liner is disposed on a sidewall of the second trench.

Example 17 is a method of forming a microelectronic device, comprising: forming a first liner in a first trench, wherein the first trench is disposed in a dielectric layer that is disposed on a substrate; forming a second liner in a second trench, wherein the second trench is adjacent the first trench; forming an interconnect material on the first liner in the first trench; adjusting a resistance value of the second liner; forming a first contact structure on a top surface of the interconnect material; and forming a second contact structure on the second liner.

Example 18 includes the method of example 17 wherein adjusting the resistance value comprises removing the second liner and forming a thin film resistor in the second trench, wherein the thin film resistor comprises a targeted resistance value.

Example 19 includes the method of example 17 wherein adjusting the resistance value comprises implanting a dopant species within the second liner to adjust the resistance value.

Example 20 includes the method of example 17 wherein adjusting the resistance value comprises applying a plasma treatment to the second liner to adjust the resistance value.

Example 21 includes the method of example 17 wherein the first liner comprises a material selected from the group consisting of tantalum, tungsten, titanium, ruthenium, molybdenum, and their alloys with nitrogen, silicon and carbon.

Example 22 includes the method of example 17 further comprising wherein the second liner comprises a thickness of between about 1 nm to about 10 nm.

Example 23 includes the method of example 17 further comprising wherein the second trench does not comprise the interconnect material.

Example 24 includes the method of example 17 further comprising wherein the interconnect material comprises copper.

Example 25 includes the method of example 17 wherein the second liner is not disposed on a sidewall of the second trench.

Example 26 includes the method of example 17 wherein the second liner is disposed in an undulating structure around a portion of the dielectric layer.

Example 27 includes the method of example 17 wherein the thin film resistor comprises a material selected from the group consisting of tantalum, titanium and copper.

Example 28 includes the method of example 17 wherein a dielectric material is disposed on the second liner within the second trench.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic device structure comprising:
    a first trench in a dielectric layer, wherein the dielectric layer comprises a portion of a substrate, and wherein the first trench comprises a first liner on a bottom of the first trench and on at least a portion of a sidewall of the first trench, wherein the first liner comprises a metal, and wherein an interconnect material is within the first trench adjacent the first liner;
    a second trench adjacent the first trench, wherein the second trench comprises a second liner on a bottom of the second trench, but absent from at least a portion of a sidewall of the second trench, wherein the second liner comprises the metal and a higher concentration of phosphorus or boron than the first liner, and wherein the second liner comprises an undulating structure that extends over lengths of the second trench that have different depths, a first length of the second liner along a bottom of a first deep portion of the second trench that is coplanar with the bottom of the first trench and a second length of the second liner along a bottom of a second deep portion of the second trench that is also coplanar with the bottom of the first trench, the first and second lengths electrically coupled together through only a third length of the second liner that lines a sidewall portion of each of the first and second deep portions of the second trench;
    a dielectric material on the second liner and within the second trench; and
    a contact structure physically and electrically coupled to the second liner in the second trench.

2. The microelectronic device structure of claim 1, wherein the dielectric material on the second liner is within only a first portion of the second trench, and wherein the contact structure is within a second portion of the second trench, adjacent the first portion.

3. The microelectronic device structure of claim 2, wherein the second liner comprises tantalum, titanium and copper, titanium nitride, tantalum oxide, tungsten, cobalt, ruthenium, nickel, silver, or aluminum, or combinations thereof.

4. The microelectronic device structure of claim 3, wherein the first liner comprises tantalum, titanium and copper, titanium nitride, tantalum oxide, tungsten, cobalt, ruthenium, nickel, silver, or aluminum, or combinations thereof.

5. The microelectronic device structure of claim 1, wherein the interconnect material is absent from the second trench.

* * * * *